United States Patent [19]

Nicollini et al.

[11] Patent Number: 5,061,901
[45] Date of Patent: Oct. 29, 1991

[54] CIRCUIT ARRANGEMENT FOR INCREASING THE GAIN-BANDWIDTH PRODUCT OF A CMOS AMPLIFIER

[75] Inventors: Germano Nicollini, Piacenza; Rinaldo Castello, Arcore, both of Italy

[73] Assignee: SGS-Thomson Microelectronics S.r.l., Milan, Italy

[21] Appl. No.: 515,952

[22] Filed: Apr. 27, 1990

[30] Foreign Application Priority Data

Apr. 28, 1989 [IT] Italy ................. 20316 A/89

[51] Int. Cl.$^5$ ............................ H03F 3/45; H03F 3/16
[52] U.S. Cl. .................................... 330/253; 330/277
[58] Field of Search ............... 330/107, 109, 110, 252, 330/253, 277, 294

[56] References Cited

U.S. PATENT DOCUMENTS 4,890,068 12/1989 Ahmed ................................. 330/253
4,914,400 4/1990 Kobayashi et al. ............. 330/253 X Primary Examiner—Steven Mottola
Attorney, Agent, or Firm—Sughrue, Mion, Zinn, Macpeak & Seas

[57] ABSTRACT

A circuit arrangement for increasing the gain-bandwidth product of a CMOS amplifier having a differential cell input stage comprises, within said input stage:

a pair of active components having a characteristic function which corresponds with that of a negative value resistor, for increasing the transconductance of the stage, a pair of capacitors being each respectively associated with a corresponding one of the active components to introduce a pole/zero pair in the frequency response from the amplifier, and an additional input stage cross-connected to the differential cell for bringing the frequency value of the zero a predetermined distance away from the amplifier clipping frequency.

7 Claims, 2 Drawing Sheets

CIRCUIT ARRANGEMENT FOR INCREASING THE GAIN-BANDWIDTH PRODUCT OF A CMOS AMPLIFIER

BACKGROUND OF THE INVENTION

This invention relates to a circuit arrangement for increasing the gain-bandwidth product of a CMOS amplifier.

As is well known, an operational amplifier is composed basically of three stages which may be schematized as follows:
- an input stage to which a signal to be amplified is applied,
- an intermediate, gain stage effective to amplify the value of said signal, and
- a final, output stage.

A so-called compensating capacitance is also provided between the input and the output of the gain stage.

For this schematization, reference can be had to the publication: "The monolithic Op Amp: a tutorial study", IEEE Solid-state Circuits, Vol SC-9, pages 314–332, December, 1974.

Also known is that the clipping frequency, i.e. the frequency fu whereat the amplifier has unit gain, is normally coincident with the gain-bandwidth product, and given by the following relation:

$$fu = (\tfrac{1}{2})*(gm/Cc) = GBWP = Ao*fd$$

where, gm is the transconductance of the input stage, Cc is the compensating capacitance, GBWP is the gain-bandwidth product, Ao is the DC gain, and fd is the frequency value at which the gain begins to decrease.

The value of the clipping frequency fu is virtually fixed by the technology, for it should be lower than, but lie not too close to, the value of the dominant pole, lest a deterioration occurs in the so-called phase boundary, the latter being a parameter indicating the stability of a system incorporating a regenerative amplifier.

In many audio applications requiring very low distortion, and wherever the amplifier is employed as a line driver in so-called ISDN networks, there exists a need to have the gain-bandwidth product increased as much as possible relatively to its state coincident with the clipping frequency.

In an attempt at meeting the above demand, the prior art has proposed a solution which consists of introducing a so-called doublet in the open loop frequency response from the operational amplifier at much lower frequencies than the clipping frequency.

In essence, it is a matter of inserting, in the transfer function of the operational amplifier, a pole/zero pair while causing their presence to affect to a negligible amount the value of the phase boundary that is imparting stability to the amplifier.

Such an approach is described, for example, in the publication "A monolithic P-channel JFET quad operational amplifier . . . ", IEEE Journal of Solid State Circuits, Vol. SC-22, No. 6, December 1987, relating the introduction of said doublet to the input stage of the amplifier.

That approach, while basically achieving its objective, has a serious drawback in that it can only be applied substantially to amplifier stages comprising transistors of the bipolar JFET type, and not to the CMOS technology. This results from that the transconductance of CMOS transistors is, for a given size and given bias currents, much lower than that of bipolar transistors, so that the insertion of a pole/zero pair, in accordance with the prior art teachings, in an amplifier comprising MOS transistors would require transistors of a huge size and a very high current flowing therethrough to provide the effect sought.

SUMMARY OF THE INVENTION

The technical problem that underlies this invention is to provide a circuit arrangement which has such structural and functional characteristics as to enable the gain-bandwidth product to be increased of an operational amplifier which comprises CMOS transistors of conventional dimensions.

This technical problem is solved by a circuit arrangement as indicated being characterized in that it comprises, within said input stage,
- a pair of active components having a characteristic function which corresponds with that of a negative value resistor, for increasing the transconductance of said stage,
- a pair of capacitors, each respectively associated with a corresponding one of the active components for introducing a pole/zero pair in the frequency response from the amplifier, and
- an additional input stage cross-connected to said cell to bring the frequency value of said zero a predetermined distance away from that of said pole and at a lower frequency than the clipping frequency of the amplifier.

The features and advantages of the circuit arrangement of this invention will be appreciated from the following detailed description of an embodiment thereof, given by way of illustration and not of limitation with reference to the accompanying drawings

DETAILED DESCRIPTION OF THE INVENTION

Figure 1:
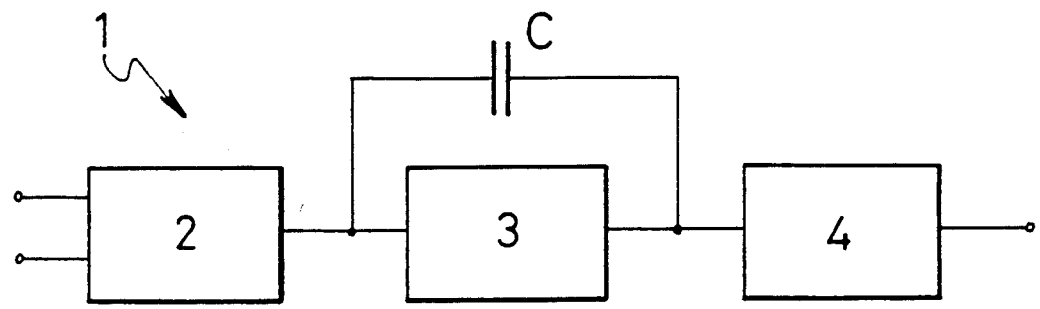
FIG. 1 is a block diagram showing schematically an operational amplifier.

With reference to the drawing views, generally and schematically shown at 1 is an operational amplifier which is composed of three cascade-connected stages.

More specifically, there are shown schematically: an input stage 2 whereto an electric signal to be amplified is applied, an intermediate gain stage 3 effective to amplify the value of said signal in co-operation with the preceding stage, and an output stage 4.

Also provided is a compensating capacitor C between the input and the output of the gain stage 3, effective to regulate the value of the dominant pole fd of the amplifier.

Figure 2:
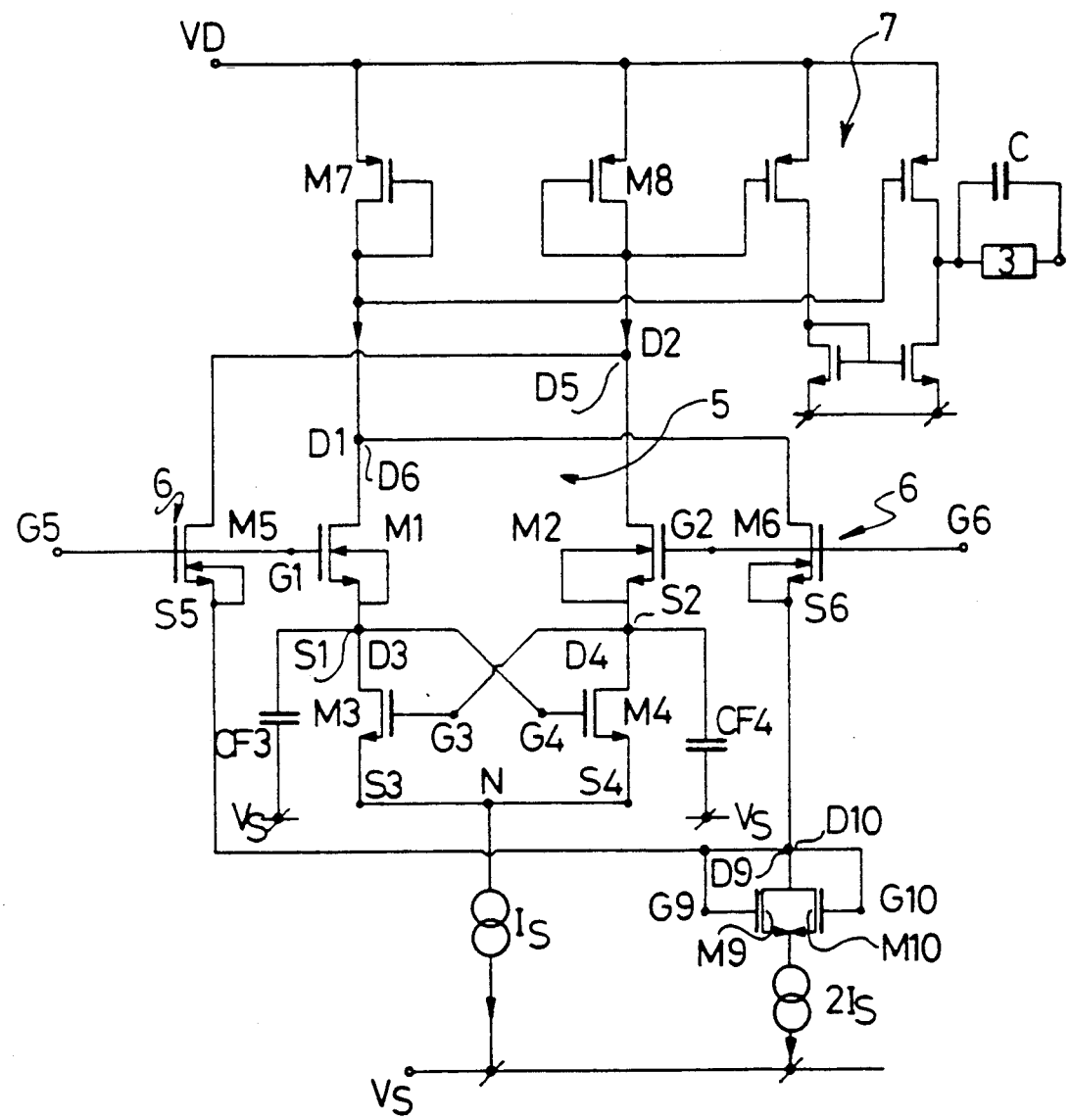
FIG. 2 is a wiring diagram of a circuit arrangement according to the invention as incorporated to the input stage of the amplifier shown in FIG. 1.

With specific reference to the example of FIG. 2, there is shown the structure of the input stage 2 of the amplifier 1 in greater detail.

That stage 2 comprises essentially a differential cell 5 structure with a pair of n-channel enhancement MOS transistors M1 and M2 which have their respective drain electrodes D1 and D2 connected to a positive supply pole Vd through corresponding p-channel MOS-type transistors M7 and M8 connected in a diode configuration.

The cell 5 further comprises a pair of active components M3 and M4, each consisting of an n-channel MOS-type transistor.

The transistor M3 has its drain electrode D3 connected to the source electrode S1 of transistor M1; whilst the second transistor M4 has its corresponding drain electrode D4 connected to the source electrode S2 of the other transistor M2 in the cell 5.

The respective source electrodes S3 and S4 of this second transistor pair, M3 and M4, are connected together and led to a circuit node N connected to a voltage supply pole Vs via a current source Is or generator.

The transistors M3 and M4 are cross-connected to each other by having their respective gate electrodes G3 and G4 connected each to the corresponding drain electrode D4 and D3 of the other transistor in the pair.

Further, such transistors have a characteristic function which corresponds to that of a negative value resistor R, thereby they are effective to increase the transconductance value gm1 of the differential cell 5 to which they are incorporated, as explained hereinafter.

In the cell 5 there are provided, moreover, a pair of capacitors CF3 and CF4, each respectively associated with a corresponding one of the active components, M3 and M4. More specifically, a first capacitor CF3 is connected between the drain electrode D3 of transistor M3 and the pole Vs, whilst the other capacitor CF4 is connected between the drain electrode D4 of the other transistor M4 and the pole Vs.

These capacitors are intended to introduce, in the frequency response from the amplifier, a pole/zero pair, fp and fz', where fz' is in the right-hand half plane.

Also provided is a circuit portion 6 adapted to return, to the frequency response from the amplifier 1, the value of the zero in the left-hand half plane at a frequency fz lying a predetermined distance away from that of the pole fp and being lower than the clipping frequency ft.

That circuit portion 6 comprises an n-channel MOS-type transistor having its gate electrode G5 connected to the gate G1 of the transistor M1 of cell 5 and its drain electrode D5 connected to the drain electrode D2 of the second transistor M2 in the cell 5.

In addition, the circuit portion 6 comprises another n-channel MOS-type transistor M6 which has its gate electrode G6 connected to the gate electrode G2 of the second transistor M2, and its drain electrode D6 connected to the drain D1 of the first transistor M1.

The respective source electrodes S5 and S6 of the last-named transistors, M5 and M6, are connected together and to the respective source electrodes G9 and G10 and drain electrodes D9 and D10 of a pair of transistors M9 and M10 in parallel with each other. These transistors M9 and M10 have their corresponding source electrodes S9 and S10 connected to each other and to the supply pole Vs via a current source or generator, indicated at 2Is since it has twice the value of the previously mentioned generator Is.

The transistors M9 and M10 have the function of making the drain-to-source voltage drop of transistors M5 and M6 in the additional stage 6 equal to the drain-to-source voltage drop of the first transistor pair M1 and M2 in the cell 5.

The structure of the input stage 2 described above is connected to the gain stage 3 of amplifier 1 through an interconnecting circuit portion 7, known per se.

The operation of the inventive amplifier will be now described with reference to the example shown in FIG. 3, where a graph for the frequency response from this amplifier is depicted schematically.

Figure 3:
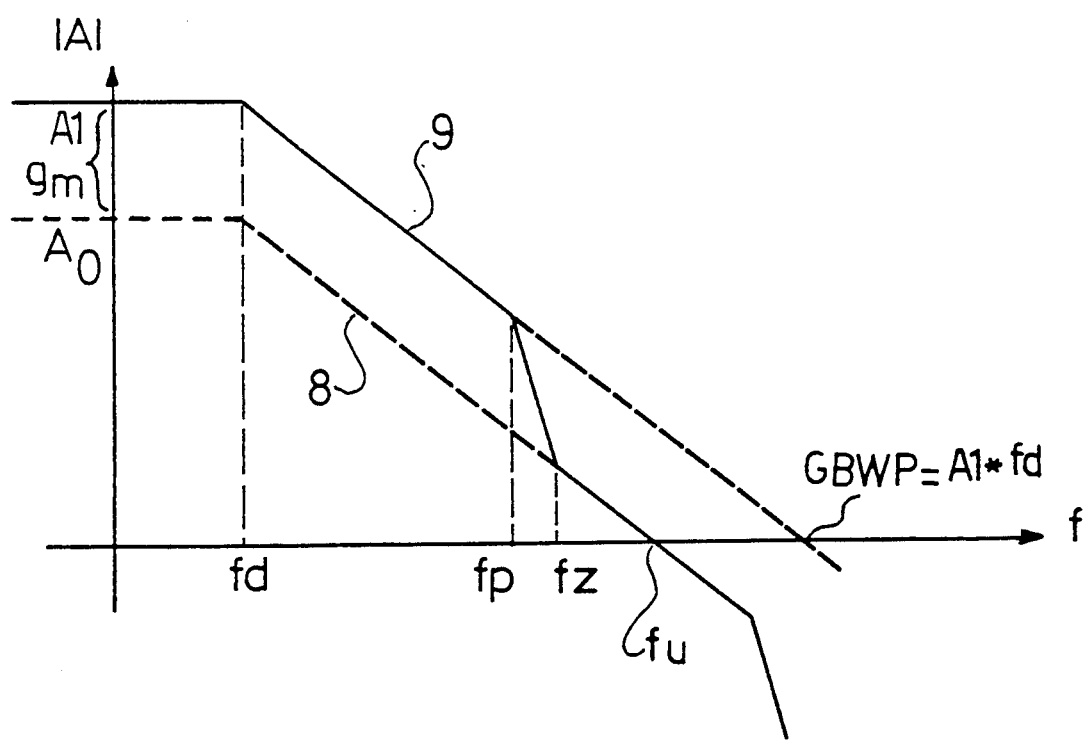
FIG. 3 is a graph illustrating schematically the frequency response from the amplifier of FIG. 2.

In FIG. 3, there is indicated at 8 the open loop frequency response from a conventional amplifier. The reference character Ao denotes the DC gain, and fd denotes the dominant pole of the amplifier, that is the frequency value whereat the gain begins to decrease. That value can be adjusted through the compensating capacitor C.

The frequency response from the inventive amplifier is the curve denoted by 9, from which it can be seen that, for a given range of frequencies substantially below that of the pole fp, the gain A1 of the amplifier according to the invention is greater than the gain A0 of conventional amplifiers.

This results from the pair of active components M3 and M4 provided in the differential cell enabling the transconductance to be increased of the input stage 5, and hence the overall gain, according to the following relation:

$$gm = gm1*/(1 - gm1/gm3)$$

where, gm1 is the transconductance of the differential pair formed by transistors M1 and M2, and gm3 is the value of the transconductance of one of the active components, M3 and M4, and is the equal of a negative resistance value $(-R)$.

It follows from the above relation that the presence of the active components M3 and M4 allows the value of the equivalent transconductance of the differential stage 5 incorporating them to be increased considerably.

As the frequency increases, however, the effect of the capacitors CF3 and CF4 tends to prevail which exclude the contribution from the transistors M3 and M4, progressively reducing the effect of the latter on the gain gm which, with high frequencies, will again coincide with the gain gm1 of the differential pair M1 and M2.

The capacitors CF3 and CF4 are selected to have the same value CF, and their provision is effective to introduce, in the open loop frequency response from the differential cell 5, a pole/zero pair for frequencies denoted by fp and fz'.

The value of frequency fp is given by the following relation:

$$fp = (gm1 - gm3)/2\pi*CF$$

and the value of fz' is given by the relation $$fz' = gm3/2\pi*CF.$$

Note should be taken, however, of that the zero of fz' locates in the right-hand half plane of the phase diagram and its contribution would not be that expected for the purpose of this invention.

Accordingly, the additional input stage 6, consisting of transistors M5, M6, M9 and M10, and the generator or source 2Is, serves to bring said zero back to the left-hand half plane such that it will coincide with a frequency fz having a value approximating that of the pole fp. This additional stage 6 has a predetermined gain, or transconductance if preferred, value.

In particular, by using transistors M5 and M6 having twice the dimensions of the corresponding transistors M1 and M2, and through which a current flows which is twice as high, it follows that the gain of that additional input stage 6 will be twice as great as the gain gm1.

This enables the zero introduced by capacitors CF3, CF4 to be brought back to a frequency value fz very close to that of the pole fp and given by the following relation:

$$fz = (2gm1 - gm3)/2\pi * CF$$

Therefore, in consideration of the joint effect of the input stages 5 and 6 incorporated to stage 2, it can be shown that the increase in the value of gain-bandwidth product GBWP for the amplifier 1 may be as much as ten times higher than the value of the clipping frequency fu. This is a result which may be regarded as unexpected, to say the least, with amplifiers made in CMOS technology.

We claim:

1. A circuit arrangement for increasing the gain-bandwidth product of a CMOS amplifier having a differential cell input stage, characterized in that it comprises, within said input stage:
   a pair of active components having a characteristic function which corresponds with that of a negative value resistor, for increasing the transconductance of said stage,
   a pair of capacitors, each respectively associated with a corresponding one of the active components for introducing a pole/zero pair in the frequency response from the amplifier, and
   an additional input stage cross-connected to said cell to bring the frequency value of said zero a predetermined distance away from that of said pole and at a lower frequency than a clipping frequency of the amplifier.

2. A circuit arrangement according to claim 1, characterized in that said active components are MOS-type transistors cross-connected to each other.

3. A circuit arrangement according to claim 1, characterized in that it comprises an additional input stage including a pair of MOS transistors coupled with corresponding transistors in said differential cell by forward connections between their respective gate electrodes and cross-connections between their respective drain electrodes.

4. A circuit arrangement according to claim 3, characterized in that said additional input stage comprises MOS transistors having twice the dimensions and having twice the current of the transistor pair incorporated to said differential cell stage.

5. A circuit arrangement according to claim 3, characterized in that it comprises a circuit portion effective to maintain a drain-to-source voltage drop across said transistors in said stage equal to the drain-to-source voltage drop across the transistor pair forming said differential cl.

6. A circuit arrangement according to claim 5, characterized in that said circuit portion comprises a pair of transistors coupled in parallel with each other and having their respective source electrodes connected to a supply pole via a current generator, with the drain and gate electrodes of said transistor pair connected to the corresponding source electrodes of the additional input stage.

7. A circuit arrangement according to claim 3, characterized in that the pair of transistors in said cell have each their respective drain electrodes connected to a supply pole via respective transistors in a diode configuration.

* * * * *